(12) United States Patent
Meyer et al.

(10) Patent No.: US 9,730,310 B2
(45) Date of Patent: Aug. 8, 2017

(54) METAL-CERAMIC SUBSTRATE

(71) Applicant: Curamik Electronics GmbH, Eschenbach (DE)

(72) Inventors: Andreas Meyer, Wenzenbach (DE); Christoph Wehe, Wenzenbach (DE); Jürgen Schulz-Harder, Lauf (DE); Karsten Schmidt, Eschenbach (DE)

(73) Assignee: ROGERS GERMANY GMBH, Eschenbach (DE)

( * ) Notice: Subject to any disclaimer, the term of this patent is extended or adjusted under 35 U.S.C. 154(b) by 113 days.

(21) Appl. No.: 14/350,661

(22) PCT Filed: Feb. 13, 2013

(86) PCT No.: PCT/DE2013/100054
§ 371 (c)(1),
(2) Date: Apr. 9, 2014

(87) PCT Pub. No.: WO2013/120486
PCT Pub. Date: Aug. 22, 2013

(65) Prior Publication Data
US 2014/0345914 A1 Nov. 27, 2014

(30) Foreign Application Priority Data

Feb. 15, 2012 (DE) .................... 10 2012 101 201
Mar. 27, 2012 (DE) .................... 10 2012 102 611

(51) Int. Cl.
*H05K 1/02* (2006.01)
*H05K 3/38* (2006.01)
(Continued)

(52) U.S. Cl.
CPC .......... *H05K 1/0201* (2013.01); *B32B 9/005* (2013.01); *B32B 15/04* (2013.01); *B32B 15/20* (2013.01);
(Continued)

(58) Field of Classification Search
CPC .......... H05K 1/201; B32B 15/04; B32B 15/20
(Continued)

(56) References Cited

U.S. PATENT DOCUMENTS 4,409,278 A * 10/1983 Jochym ................ B23K 35/001
228/124.1
4,558,171 A * 12/1985 Gantley ................ H01L 23/057
174/50.61

(Continued)

FOREIGN PATENT DOCUMENTS

CN 1332265 1/2002
DE 10 2009 041 574 5/2010
(Continued)

*Primary Examiner* — Chau N Nguyen
*Assistant Examiner* — Muhammed Azam
(74) *Attorney, Agent, or Firm* — Welsh Flaxman & Gitler LLC

(57) ABSTRACT

A metal-ceramic substrate having at least one ceramic layer (2), which is provided on a first surface side (2a) with at least one first metallization (3) and on a second surface side (2b), opposite from the first surface side (2a), with a second metallization (4), wherein the first metallization (3) is formed by a film or layer of copper or a copper alloy and is connected to the first surface side (2a) of the ceramic layer (2) with the aid of a "direct copper bonding" process. The second metallization (4) is formed by a layer of aluminum or an aluminum alloy.

13 Claims, 12 Drawing Sheets

(51) Int. Cl.
*C04B 37/00* (2006.01)
*B32B 15/04* (2006.01)
*B32B 15/20* (2006.01)
*C04B 37/02* (2006.01)
*B32B 9/00* (2006.01)

(52) U.S. Cl.
CPC ......... *C04B 37/006* (2013.01); *C04B 37/008* (2013.01); *C04B 37/021* (2013.01); *C04B 37/026* (2013.01); *C04B 37/028* (2013.01); *H05K 3/38* (2013.01); *C04B 2237/121* (2013.01); *C04B 2237/124* (2013.01); *C04B 2237/343* (2013.01); *C04B 2237/365* (2013.01); *C04B 2237/366* (2013.01); *C04B 2237/368* (2013.01); *C04B 2237/402* (2013.01); *C04B 2237/407* (2013.01); *C04B 2237/54* (2013.01); *C04B 2237/704* (2013.01); *C04B 2237/706* (2013.01); *C04B 2237/86* (2013.01); *Y10T 156/10* (2015.01); *Y10T 428/12535* (2015.01); *Y10T 428/26* (2015.01); *Y10T 428/266* (2015.01)

(58) Field of Classification Search
USPC ....................................................... 174/252
See application file for complete search history.

(56) References Cited

U.S. PATENT DOCUMENTS

| | | | | |
|---|---|---|---|---|
| 4,959,507 A * | 9/1990 | Tanaka | ................ | H01L 21/4839 174/257 |
| 5,985,464 A * | 11/1999 | Schmitt | ................. | B22D 19/04 228/120 |
| 6,033,787 A | 3/2000 | Nagase | | |
| 6,699,571 B1 * | 3/2004 | Antalek | ................. | B32B 15/06 257/675 |
| 2002/0105075 A1 * | 8/2002 | Ferber | ................. | H01L 21/4853 257/735 |
| 2002/0125563 A1 * | 9/2002 | Scheuermann | ......... | H01L 23/15 257/700 |
| 2004/0131832 A1 * | 7/2004 | Tsukaguchi | ......... | H01L 23/3735 428/210 |
| 2005/0126758 A1 * | 6/2005 | Schulz-Harder | ........ | F28D 15/04 165/104.21 |
| 2006/0022020 A1 * | 2/2006 | Schulz-Harder | ....... | H05K 3/061 228/122.1 |
| 2006/0123909 A1 * | 6/2006 | Rettig | ................... | G01D 5/2451 73/514.39 |
| 2006/0183298 A1 * | 8/2006 | Schulz-Harder | ....... | B28D 1/221 438/460 |
| 2006/0263584 A1 * | 11/2006 | Schulz-Harder | ........ | C22C 49/14 428/292.1 |
| 2007/0261778 A1 * | 11/2007 | Schulz-Harder | ........ | B32B 18/00 156/89.18 |
| 2009/0224399 A1 * | 9/2009 | Kaga | ................... | C04B 35/5935 257/712 |
| 2009/0232972 A1 * | 9/2009 | Schulz-Harder | ...... | C04B 37/021 427/99.2 |
| 2010/0105210 A1 * | 4/2010 | Chen | ................... | H01L 21/0337 438/702 |
| 2010/0132932 A1 * | 6/2010 | Kluge | ................... | C04B 37/021 165/185 |
| 2010/0227114 A1 * | 9/2010 | Tang | ........................ | B32B 7/12 428/114 |
| 2010/0288537 A1 * | 11/2010 | Chiang | .............. | H05K 7/20509 174/252 |
| 2010/0290490 A1 * | 11/2010 | Hammel | ............. | H01L 23/3735 372/36 |
| 2011/0274888 A1 * | 11/2011 | Tang | ...................... | B82Y 30/00 428/189 |
| 2011/0303348 A1 * | 12/2011 | Weidenauer | .......... | C04B 37/021 156/89.27 |
| 2011/0318886 A1 * | 12/2011 | Tsao | .................... | H05K 3/1208 438/125 |
| 2012/0069524 A1 * | 3/2012 | Schulz-Harder | .... | H01L 23/3735 361/716 |
| 2012/0107642 A1 * | 5/2012 | Meyer | ................... | B82Y 30/00 428/623 |
| 2012/0134115 A1 * | 5/2012 | Schulz-Harder | .... | H01L 23/3735 361/720 |
| 2012/0305281 A1 * | 12/2012 | Knoll | ................... | H01L 21/4846 174/50 |
| 2014/0338162 A1 * | 11/2014 | Schulz-Harder | ...... | C04B 37/025 29/17.3 |

FOREIGN PATENT DOCUMENTS

| | | |
|---|---|---|
| DE | 10 2011 103 746 | 12/2012 |
| EP | 0676800 | 10/1995 |
| EP | 2530707 | 12/2012 |
| JP | 3171234 | 5/2001 |
| JP | 2003197826 A | 7/2003 |
| JP | 2011183798 | 9/2011 |

* cited by examiner

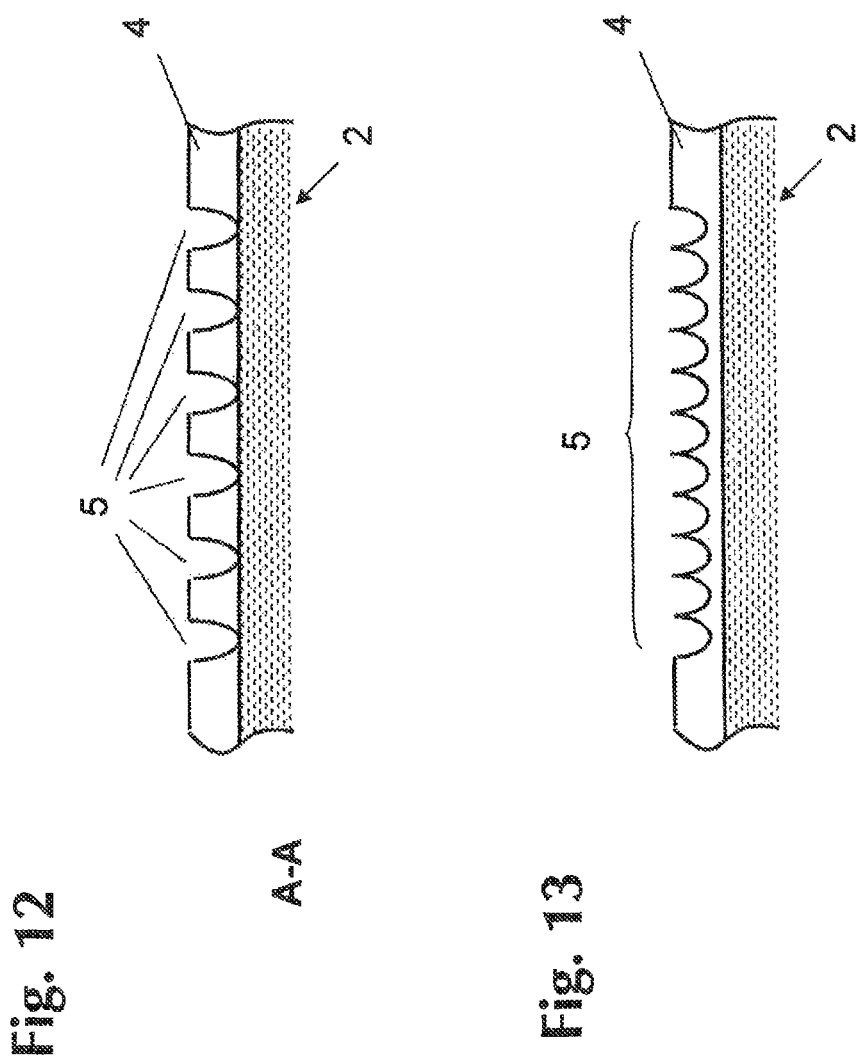

METAL-CERAMIC SUBSTRATE

BACKGROUND OF THE INVENTION

The invention relates to a metal-ceramic substrate including at least one ceramic layer (2), which is provided with at least a first metallization (3) on a first surface side (2a) and with a second metallization (4) is provided on a second surface side (2b) lying opposite the first surface side (2a), wherein the at least one first metallization (3) is constituted by a foil or layer of copper or a copper alloy, wherein the first metallization (3) is bonded with the first surface side (2a) of the ceramic layer (2) with the aid of a "direct copper bonding" process and to a method for producing a metal-ceramic.

Metal-ceramic substrates in the form of printed circuit boards including an insulating layer of ceramic, and including at least one metallization bonded with a surface side of the insulating layer of ceramic and structured for the formation of strip conductors, contacts, contact and fastening regions, are known in various embodiments.

Of particular importance here is the cooling of such metal-ceramic substrates, which can take place for example by direct contact of the surface side of the ceramic lying opposite the structured metallization or of a metallization in thermally conductive connection with said ceramic with a cooling medium or a cooling body. Especially when use is made of a fluid or gaseous cooling medium, there are particular demands on the metal-ceramic substrate, for example with regard to resistance to corrosion and quality of the thermal conductivity. When such substrates are used in the motor vehicle sector, it is for example desirable to use the coolant circuit provided for cooling the vehicle also to cool the substrate.

The so-called "DCB process" ("direct copper bonding"), for example, is also known for bonding metal layers or sheets, preferably copper sheets or foils with one another and/or with ceramic or ceramic layers, and more precisely using metal or copper sheets or metal or copper foils which comprise on their surface sides a layer or a coating ("fusion layer") comprising a chemical compound of the metal and a reactive gas, preferably oxygen. In this process described for example in US-PS 37 44 120 or in DE-PS 23 19 854, this layer or this coating ("fusion layer") forms a eutectic with a melting temperature below the melting temperature of the metal (e.g. copper), so that, by placing the metal or copper foil onto the ceramic and by heating all the layers, the latter can be bonded to one another, and more precisely by fusion of the metal or copper essentially only in the region of the fusion layer or oxide layer. Such a DCB process comprises, for example, the following process steps:

- oxidation of a copper foil in such a way that a uniform copper oxide layer results;
- placing of the copper foil with the uniform copper oxide layer onto the ceramic layer;
- heating of the composite to a process temperature between approx. 1025 to 1083° C., for example to approx. 1071° C.;
- cooling to room temperature.

Furthermore, the so-called active soldering process for bonding metal layers or metal foils forming s, in particular also copper layers or copper foils, with a ceramic material or a ceramic layer is known from publications DE 22 13 115 and EP-A-153 618. In this process, which is used especially also for producing metal-ceramic substrates, a bond is produced at a temperature between approx. 800-1000° C. between a metal foil, for example copper foil, a ceramic substrate, for example an aluminum nitride ceramic, using a hard solder, which also contains an active metal in addition to the main components such as copper, silver and gold. This active metal, which is for example at least one element of the group Hf, Ti, Zr, Nb, Ce, produces a bond between the hard solder and the ceramic through a chemical reaction, whilst the bond between the hard solder and the metal is a metallic hard soldered joint.

Proceeding from the aforementioned art, the problem underlying invention is to provide a metal-ceramic substrate as well as a method for its production, which is suitable for cooling by means of fluid or gaseous cooling media. The problem is solved by a metal-ceramic substrate and a method for its production.

SUMMARY OF THE INVENTION

One main aspect of the metal-ceramic substrate according to the invention is to be seen in the fact that the second is constituted by a layer of aluminum or an aluminum alloy. By using aluminum or an aluminum alloy to constitute the second metallization of a metal-ceramic substrate, the second metallization can be brought particularly advantageously into direct contact with fluid or gaseous cooling media for cooling purposes without a long-term impairment of the mode of functioning of the metal-ceramic substrate thereby being caused, for example by corrosion of the second metallization. The second metallization is particularly advantageously constituted by aluminum or an aluminum alloy, wherein the surface of the aluminum layer or aluminum alloy can also be anodized. The second metallization of aluminum or an aluminum alloy can advantageously be bonded either directly or indirectly with the ceramic layer.

In a development of the invention, the metal-ceramic substrate according to the invention is for example constituted such that the first metallization has a layer thickness between 0.1 mm and 1.0 mm, preferably between 0.2 mm and 0.8 mm and/or is structured for the formation of contact or bonding areas, and/or that the second metallization of aluminum or an aluminum alloy has a layer thickness between 0.05 mm and 1.0 mm, preferably between 0.2 mm and 0.6 mm, and/or that the second is constituted plate-like, sheet-like and/or half-shell-shaped, and/or that the ceramic layer is produced from an oxide, nitride or carbide ceramic such as aluminum oxide or aluminum nitride or silicon nitride or silicon carbide or aluminum oxide with zirconium oxide and/or has a layer thickness between 0.2 mm and 1.0 mm, preferably between 0.3 mm and 0.4 mm, wherein the aforementioned features can each be used individually or in any combination.

In a further advantageous variant of embodiment, the metal-ceramic substrate according to the invention is constituted such that a plurality of recesses of differing shape and/or depth are introduced into the second metallization and/or the surface side of the second metallization is provided with cooling elements of differing shape and/or height protruding outwards from the surface side, and/or that the recesses are constituted channel-like, slot-like, oval, elongated-hole shaped, circular or diamond-shaped and/or extend at least in sections over at least a quarter of the layer thickness of the second metallization, and/or that the recesses are constituted in the form of holes with at least a hole depth of 0.05 mm in order to increase the size of the surface of the second metallization, wherein the arrangement of the holes preferably takes place in the manner of a matrix, and/or that the holes extend to the surface of the ceramic layer (2) and/or are introduced into the surface of the ceramic layer (2) directly beside one another and/or overlapping at least in sections, and/or that the cooling elements are constituted rib-like, elongated-hole shaped, circular or diamond-shaped and/or have of a height of 1 mm to 10 mm, and/or that a third metallization is provided, which is bonded at the edge side with the second metallization in order to form a channel-like accommodation space for the conveying of a fluid or gaseous cooling medium, and/or that the third metallization is produced from aluminum, an aluminum alloy, special steel, a magnesium alloy or from chromium-plated or nickel-plated steels, wherein the aforementioned features can again each be provided individually or in any combination.

In a further advantageous variant of embodiment, the second metallization is bonded with the second surface side of the ceramic layer by means of a fourth metallization constituted by a layer of copper or a copper alloy. This indirect bonding of the second metallization of aluminum or an aluminum alloy with the ceramic layer by means of the further layer of copper or a copper alloy enables the formation of the second metallization as a section of a housing. The two-dimensionally extending bonding between the fourth metallization comprising a layer of copper or a copper alloy and the second metallization of aluminum or an aluminum alloy preferably takes place by means of a "direct aluminum bonding" process ("DAB process") or by adhesion using a plastic adhesive or a polymer suitable as an adhesive, preferably using an adhesive which contains carbon fibres, in particular carbon nanofibers.

Furthermore, the subject-matter in the invention is an arrangement comprising at least two metal-ceramic substrates, wherein at least one of the second metallization of the mutually opposite metal-ceramic substrates is constituted half-shell-shaped and the mutually opposite metal-ceramic substrates are bonded together in such a way that at least one tank-like metal enclosure arises. The second metallization can preferably each be constituted half-shell-shaped and can comprise a plurality of edge sections which form flange-like bonding regions. The metal-ceramic substrates are welded or glued to one another or bonded with one another in some other way permanently and preferably liquid-tight preferably in the flange-like bonding regions.

The subject-matter of the invention is also a method for producing a metal-ceramic substrate comprising at least one ceramic layer, wherein the first surface side is bonded with at least a first metallization and a second surface side lying opposite the first surface side is bonded with at least a second metallization, wherein the first metallization is constituted by a foil or layer of copper or a copper alloy. The second metallization is particularly preferably produced from aluminum or an aluminum alloy, wherein the surface of the second metallization can be anodized beforehand or afterwards.

The method according to the invention is for example constituted such that the first metallization and the ceramic layer are bonded by adhesion using a plastic adhesive or a polymer suitable as an adhesive, preferably using an adhesive which contains carbon fibres, in particular carbon nanofibres, and/or that the first metallization and the ceramic layer are bonded together with the aid of a "direct copper bonding" process or an active soldering process, and/or that the second metallization and the ceramic layer are bonded together by a "direct aluminum bonding" process ("DAB process") or by adhesion using a plastic adhesive or a polymer suitable as an adhesive, preferably using an adhesive which contains carbon fibres, in particular carbon nanofibres, and/or that the second metallization layer is bonded to the second surface side of the ceramic layer by means of a fourth metallization constituted by a layer of copper or a copper alloy, and/or that the ceramic layer is produced from an oxide, nitride or carbide ceramic such as aluminum oxide or aluminum nitride or silicon nitride or silicon carbide or aluminum oxide with zirconium oxide and/or that a plurality of recesses of differing shape and/or depth are introduced into the second metallization and/or the surface side of the second metallization is provided with cooling elements of differing shape and/or height protruding outwards from the surface side, and/or that the recesses are introduced by means of etching, a laser treatment and/or a mechanical machining process, for example sawing into the outwardly directed surface side of the second metallization, and/or that recesses in the form of holes with at least a hole depth of 0.05 mm are introduced into the upper side of the second in order to increase the size of the surface, wherein the arrangement of the holes preferably takes place in the manner of a matrix, and/or that recesses in the form of holes extending up to the surface of the ceramic layer and/or disposed directly beside one another and/or overlapping at least in sections are introduced into the surface of the ceramic layer in order to increase the size of the surface, and/or that the second metallization of a metal-ceramic substrate is constituted half-shell-shaped and is bonded together with the second metallization of a mutually opposite metal-ceramic substrate in such a way that at least one tank-like metal enclosure arises, and/or that the two metal-ceramic substrates are welded or glued to one another or bonded with one another in some other way permanently and preferably liquid-tight preferably in a flange-like bonding region of the second metallization and/or that the metal enclosure is accommodated in a metal housing conveying a fluid or gaseous cooling medium, wherein the aforementioned measures can each be used individually or in any combination. The expressions "approximately", "essentially" or "roughly" signify within the meaning of the invention deviations from the respective exact value by +/−10%, preferably by +/−5% and/or deviations in the form of variations which are unimportant for the function.

Developments, advantages and possible applications of the invention also emerge from the following description of examples of embodiment and from the figures. All the described and/or pictorially represented features are in themselves or in any combination essentially the subject-matter of the invention.

BRIEF DESCRIPTION OF THE DRAWINGS

The invention is explained in greater detail below with the aid of the figures and examples of embodiment. In the figures:

FIG. 12 shows a diagrammatic cross-sectional representation along line A-A through the second metallization according to FIG. 10 provided with holes of greater hole depth to increase the size of the surface;

FIG. 13 shows a diagrammatic cross-sectional representation through a second metallization with holes directly adjacent to and/or intersecting one another to increase the size of the surface.

DETAILED DESCRIPTION OF THE INVENTION

Figure 1:
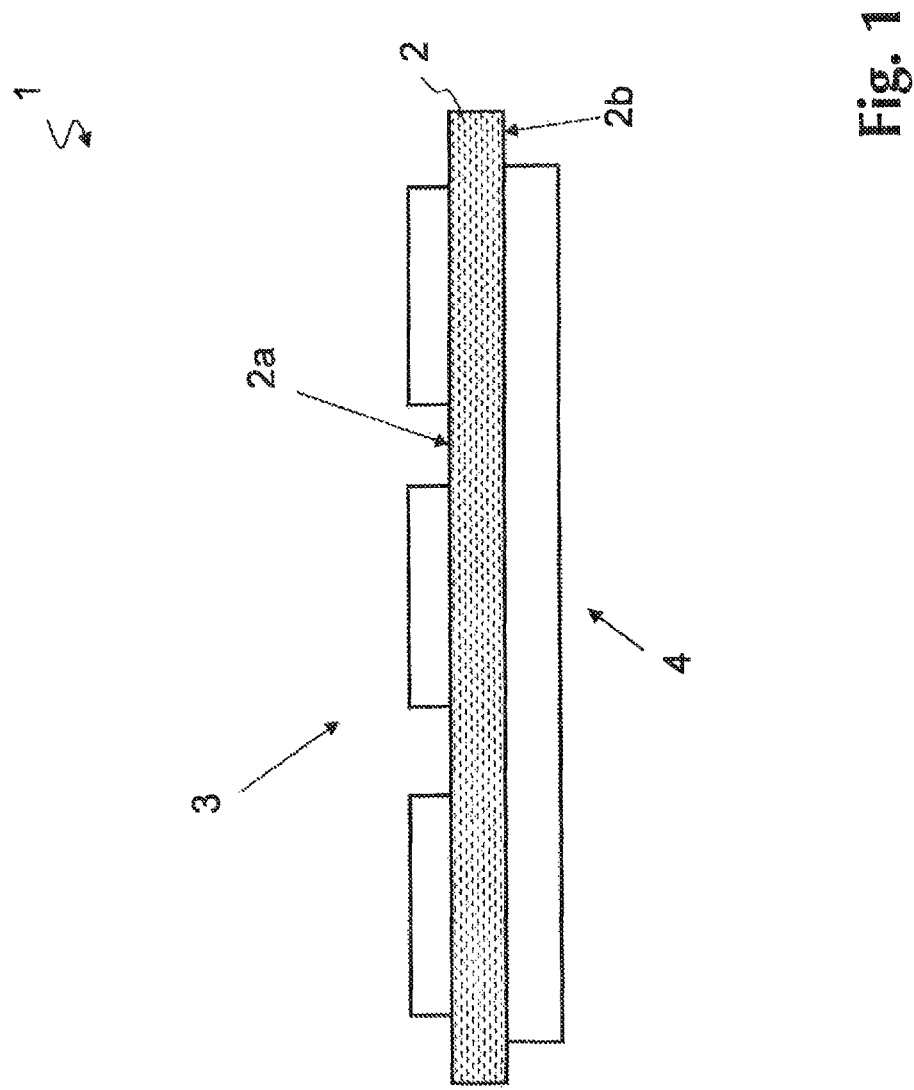
FIG. 1 shows a simplified cross-sectional representation through a metal-ceramic substrate according to the invention with a second metallization of aluminum or an ALUMINUM alloy.

FIG. 1 shows, in a simplified representation, a cross-section through a metal-ceramic substrate 1 according to the invention, comprising at least one ceramic layer 2 with two mutually opposite surface sides, and more precisely a first and second surface side 2a, 2b.

The first surface side 2a is provided with at least a first metallization 3 and the surface side 2b lying opposite first surface side 2a is provided with at least a second metallization 4, wherein the first metallization 3 is constituted or produced by a foil or layer of copper or a copper alloy. The first metallization 3 is preferably constituted structured, i.e. forms a plurality of contact regions or contact areas for the connection of the electronic components. The first metallization 3 produced from copper or a copper alloy has for example a layer thickness between 0.1 mm and 1.0 mm, preferably between 0.2 mm and 0.8 mm.

The ceramic layer 2 is produced for example from an oxide, nitride or carbide ceramic such as for example from aluminum oxide (Al2O3) or aluminum nitride (AlN) or from silicon nitride (Si3N4) or silicon carbide (SiC) or from aluminum oxide with zirconium oxide (Al2O3+ZrO2) and has a layer thickness for example between 0.2 mm and 1.0 mm, preferably between 0.3 mm and 0.4 mm.

According to the invention, the second metallization 4 is constituted by a layer of aluminum or an aluminum alloy. Through the use of aluminum or an aluminum alloy to constitute second metallization 4 of metal-ceramic substrate 1, second metallization 4 can particularly favourably also be brought into direct contact with fluid or gaseous cooling media for cooling purposes, without an impairment of the mode of functioning of metal-ceramic substrate 1 thereby being caused, for example by corrosion of second metallization 4.

Moreover, the second metallization 4 can be constituted sheet-like, plate-like or half-shell-shaped and, through an arrangement of two metal-ceramic substrates 1, an enclosure of aluminum or an aluminum alloy hermetically sealed at least in sections can be formed, which accommodates a ceramic layer 2 with a structured metallization 3 and dissipates the arising heat to a fluid or gaseous cooling medium flowing at least partially around the enclosure. The second metallization 4 is thus constituted for producing a direct heat-transfer connection to a fluid or gaseous cooling medium.

When the metal-ceramic substrate 1 is used in the motor vehicle sector, the cooling thereof can take place for example by being accommodated in the existing coolant circuit. In this regard, second metallization 4 of metal-ceramic substrate 1 is brought at least in sections into contact with the coolant.

The second metallization 4 is particularly preferably constituted in the form of an anodised layer of aluminum or an anodized layer of an aluminum alloy in order to prevent dissolution of aluminum in the coolant, especially in aqueous coolants. The anodization of the surface can take place here before or after the bonding with ceramic layer 2.

The thickness of the layer of aluminum or an aluminum alloy constituting the second metallization 4 amounts to between 0.05 mm and 1.0 mm, preferably between 0.2 mm and 0.6 mm.

A plurality of recesses 5 of differing shape and depth can preferably be introduced into the second metallization 4 or the surface side of the second metallization 4 can be provided with cooling elements 6 of differing shape and height, which in each case enlarge the surface of second metallization 4 entering into active contact with the cooling medium.

Recesses 5 can be constituted for example channel-like, slot-shaped, oval, elongated-hole shaped, circular or diamond-shaped and can extend in sections at least over a quarter of the layer thickness of the second metallization 4. Aforementioned recesses 5 preferably have a recess depth of a quarter to three quarters of the layer thickness of the second metallization 4, i.e. the recess depth can amount for example to between 0.05 mm and 0.9 mm. Recesses 5 are introduced for example by means of etching, a laser treatment and/or a mechanical machining process, for example sawing into the outwardly directed surface side the of second metallization 4.

Figure 10:
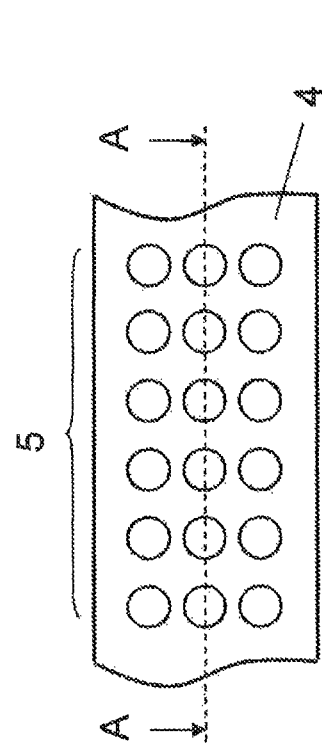
FIG. 10 shows a simplified plan view of a second metallization provided with holes to increase the size of the surface.
Figure 11:
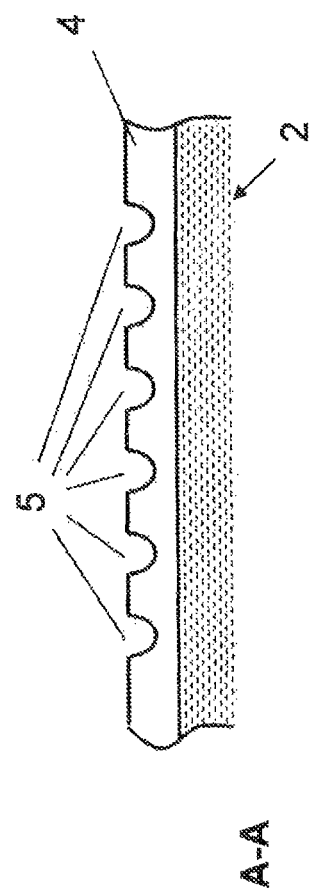
FIG. 11 shows a diagrammatic cross-section along line A-A through the second metallization according to FIG. 10 provided with holes to increase the size of the surface.

Recesses 5 can be introduced, for example to enlarge the surface of the second metallization 4, into its outwardly pointing upper side in the form of holes, and more precisely preferably in the manner of a matrix. The upper side of the second metallization 4 with recesses 5 in the form of holes disposed in the manner of a matrix is represented by way of example in a diagrammatic detail and plan view in FIG. 10. FIG. 11 also shows, in a detail representation, a cross-section along line A-A through the second metallization 4 with adjacent the ceramic layer 2 according to FIG. 10. In the variant of embodiment represented, recesses 5 formed by holes have a minimum depth of approx. 0.05 mm and can extend—as represented in FIG. 12—also up to the surface of ceramic layer 2. Alternatively, holes 5 can—as represented in FIG. 13—also be introduced into the surface of the ceramic layer 2 directly beside one another and/or at least partially overlapping. The introduction of holes 5 represented in FIGS. 12 and 13 preferably takes place by means of an etching process.

Cooling elements 6 can for example be constituted rib-like, elongated-hole shaped, circular or diamond-shaped, which protrude from the surface side of the second metallization 4. The latter can for example have a height of 1 mm to 10 mm. Cooling elements 6 and the second metallization 4 are preferably constituted here in one piece and are produced from aluminum or an aluminum alloy.

Figure 2:
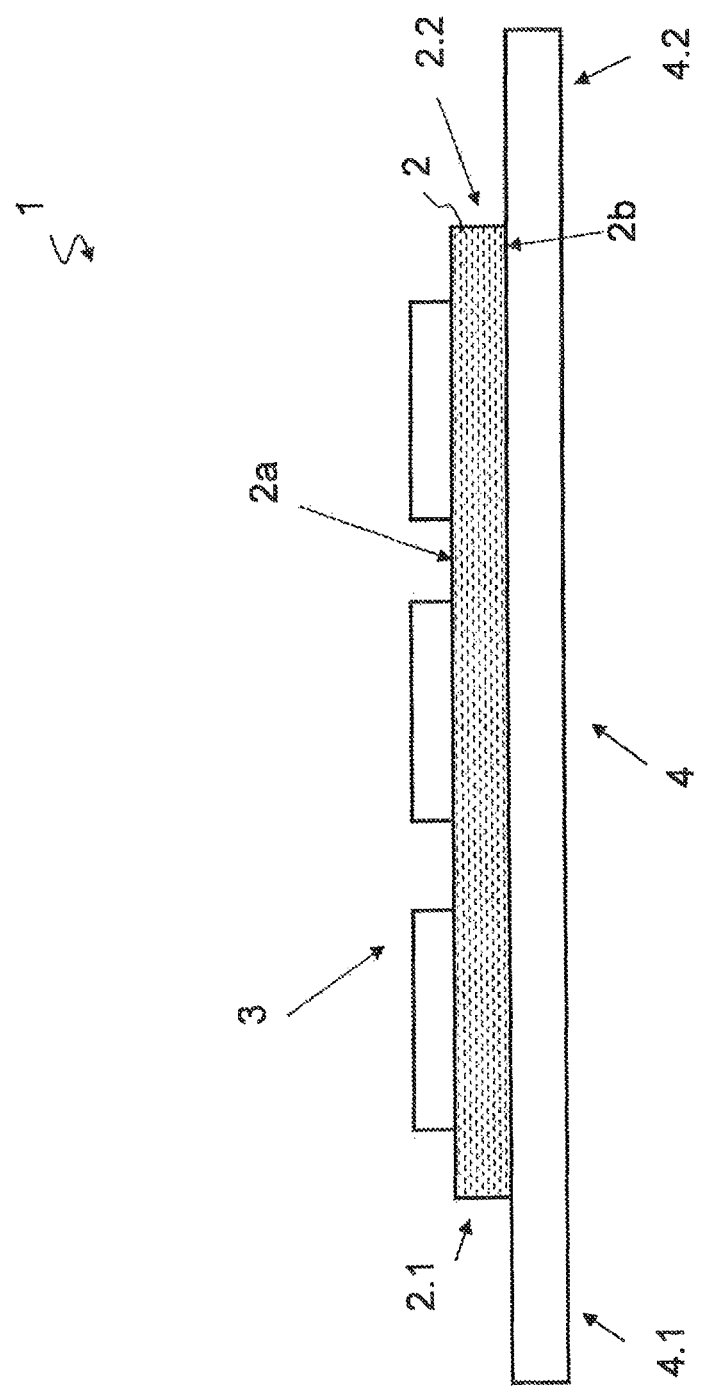
FIG. 2 shows a simplified cross-sectional representation of an alternative embodiment through a metal-ceramic substrate according to the invention with a second metallization with edge sections protruding outwards.

The second metallization 4 produced from aluminum or an aluminum alloy can be constituted for example sheet-like, plate-like or half-shell-like and can project outwards at least in sections over the edge of preferably flat ceramic layer 2. A cross-section through a metal-ceramic substrate 1 according to the invention is represented by way of example in FIG. 2, wherein ceramic layer 2 is constituted for example rectangular and comprises two mutually opposite longitudinal sides 2.1, 2.2 and two mutually opposite transverse sides 2.3, 2.4. The second metallization 4 produced from aluminum or aluminum alloy is also constituted rectangular, wherein two mutually opposite edge sections 4.1, 4.2 project over mutually opposite lateral edges 2.1, 2.2 of the ceramic layer 2. Projecting edge section(s) 4.1, 4.2 of the second metallization 4 can also, for example, particularly advantageously be brought into contact with the fluid or gaseous cooling medium.

Figure 3:
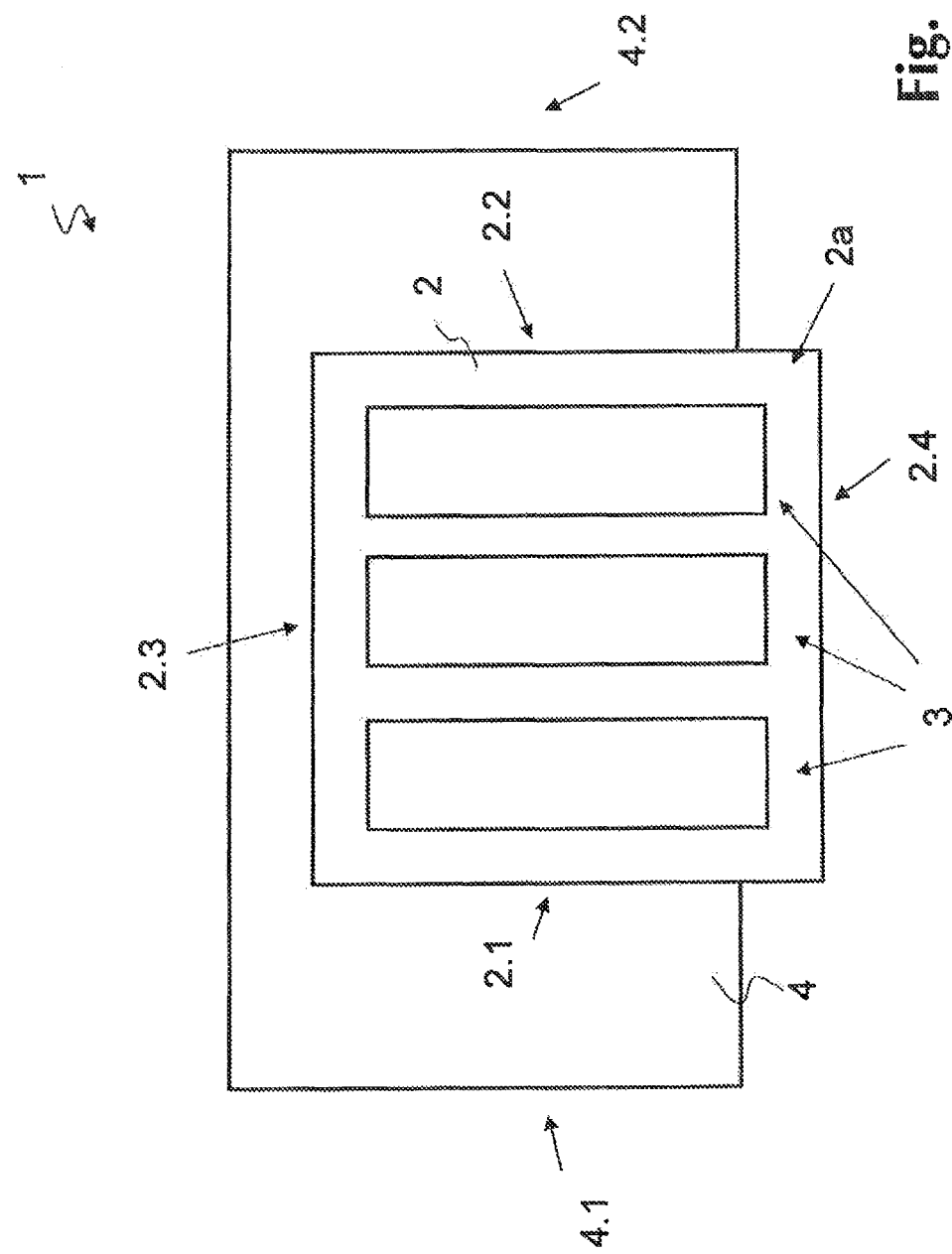
FIG. 3 shows a simplified plan view of a metal-ceramic substrate according to the invention according to FIG. 2 with one edge sections of the ceramic layer projecting over the second metallization.
Figure 4:
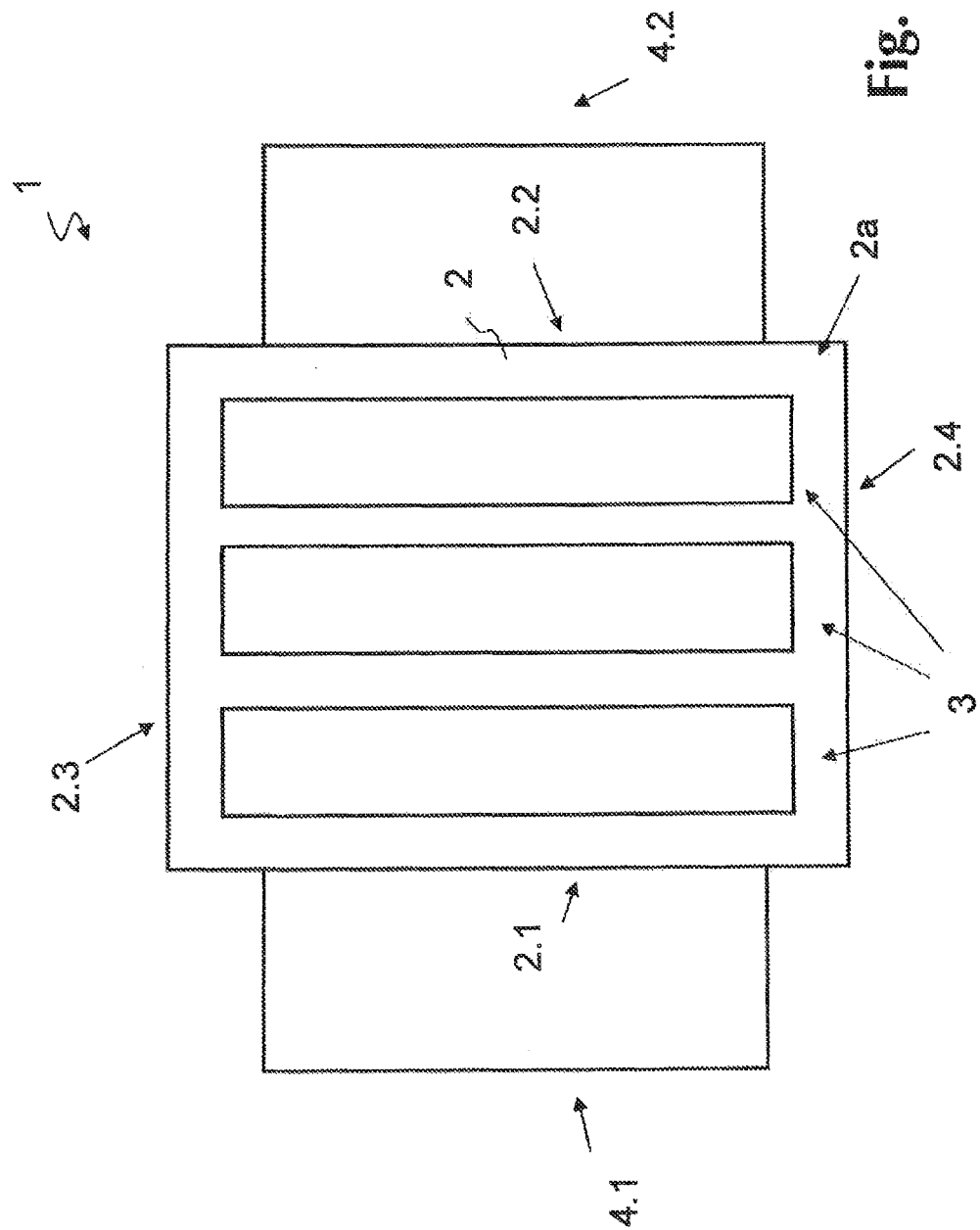
FIG. 4 shows a simplified plan view of a metal-ceramic substrate according to the invention according to FIG. 2 with two edge sections of the ceramic layer projecting over the second metallization.

In a preferred variant of embodiment according to FIGS. 3 and 4, the ceramic layer 2 of metal-ceramic substrate 1 projects at least with a transverse side 2.3, 2.4 over the plate-like second metallization 4, i.e. the second metallization 4 extends in the longitudinal direction of rectangular ceramic layer 2 only over a part of the ceramic layer 2. The electrical connections for the circuitry of the metal-ceramic substrate 1 can very advantageously be disposed on at least one of projecting transverse sides 2.3, 2.4 of the rectangular ceramic layer 2.

Taking account of the materials used for the ceramic layer 2 and the metallizations 3, 4, various processes are suitable for the two-dimensionally extending bonding of the ceramic layer 2 with the first and second metallization 3, 4.

Thus, the first metallization 3 is bonded with the ceramic layer 2 for example by gluing using a plastic adhesive or a polymer suitable as an adhesive, preferably using an adhesive which contains carbon fibres, in particular carbon nanofibres. Alternatively, the two-dimensionally extending bonding of the ceramic layer can take place by using the DCB process or with the aid of the active soldering process. The second metallization 4 of aluminum or an aluminum alloy is bonded with the ceramic layer 2 for example by a "direct aluminum bonding" process ("DAB process") or by gluing using a plastic adhesive or a polymer suitable as an adhesive, preferably using an adhesive which contains carbon fibres, in particular carbon nanofibres.

Figure 5:
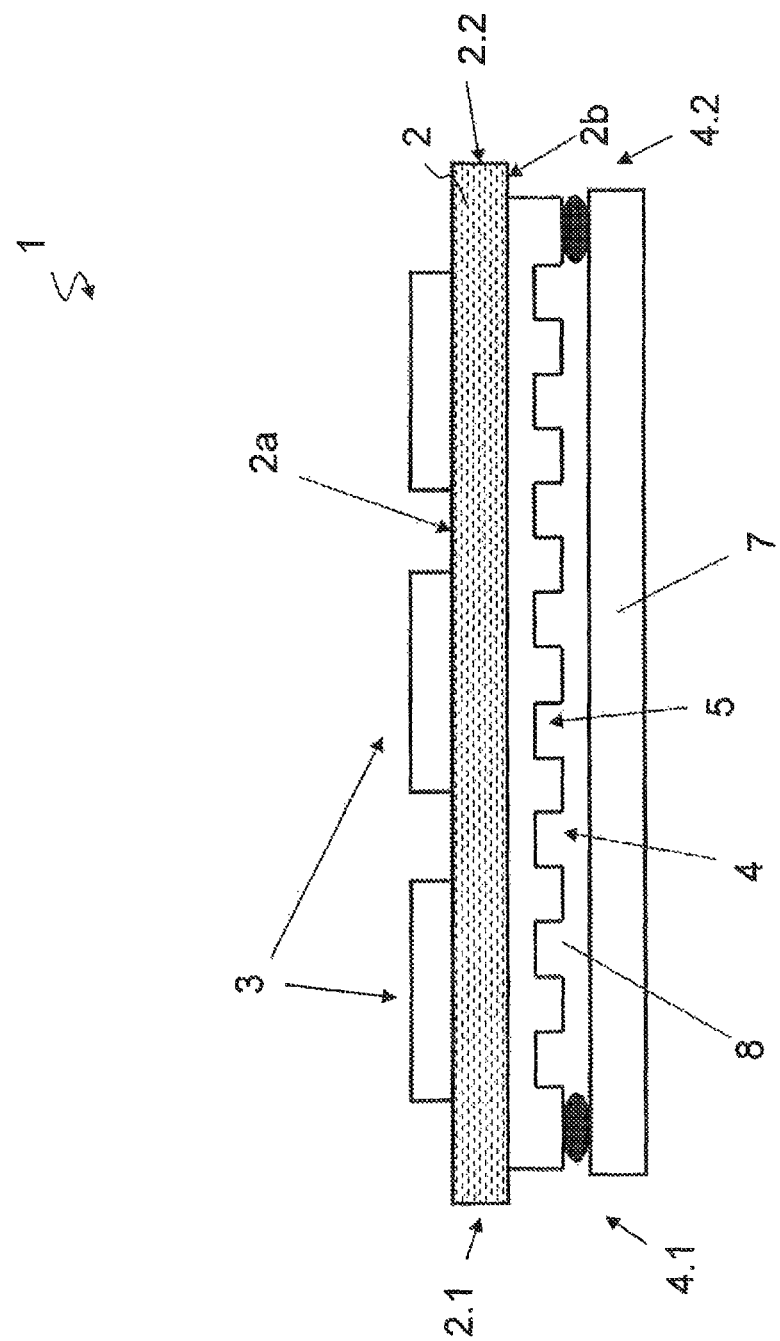
FIG. 5 shows a simplified cross-sectional representation of a metal-ceramic substrate according to the invention with a third metallization for the formation of a conveying channel.

In a preferred variant of embodiment according to FIG. 5, the second metallization 4 provided with recesses 5 is bonded with a third metallization 7, which can be produced from aluminum, an aluminum alloy, special steel, a magnesium alloy or from chromium-plated or nickel-plated steels. The second and third metallization 4, 7 are bonded to one another at the edge side, and more precisely preferably liquid- or gas-tight. At least one channel-like accommodation space 8 for conveying the fluid or gaseous cooling medium is thus formed. Use is preferably made of recesses 5 which, together with the third metallization 7, form longitudinal channels and thus enable directed conveying of the fluid or gaseous cooling medium, for example along the longitudinal axis of the substrate 1.

Figure 6:
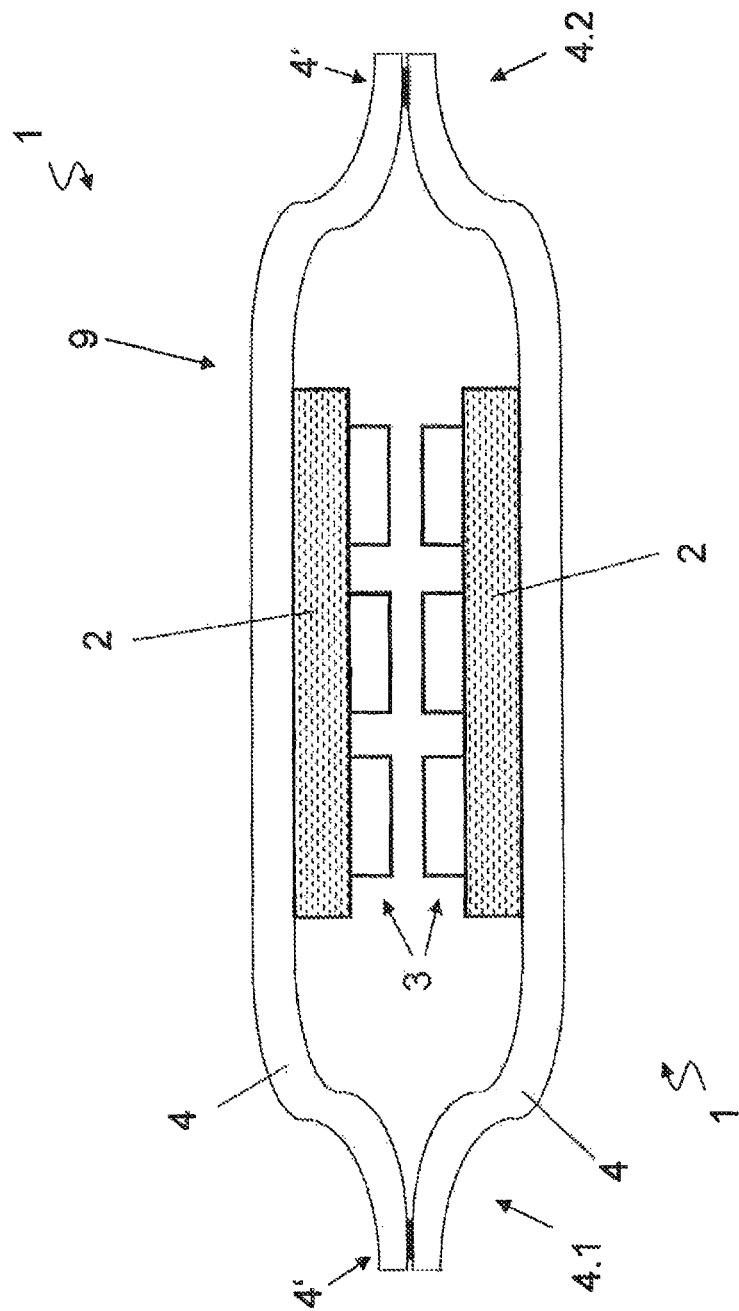
FIG. 6 shows a simplified cross-sectional representation through an arrangement comprising two metal-ceramic substrates according to the invention lying opposite one another and bonded with one another by means of their second metallization.
Figure 7:
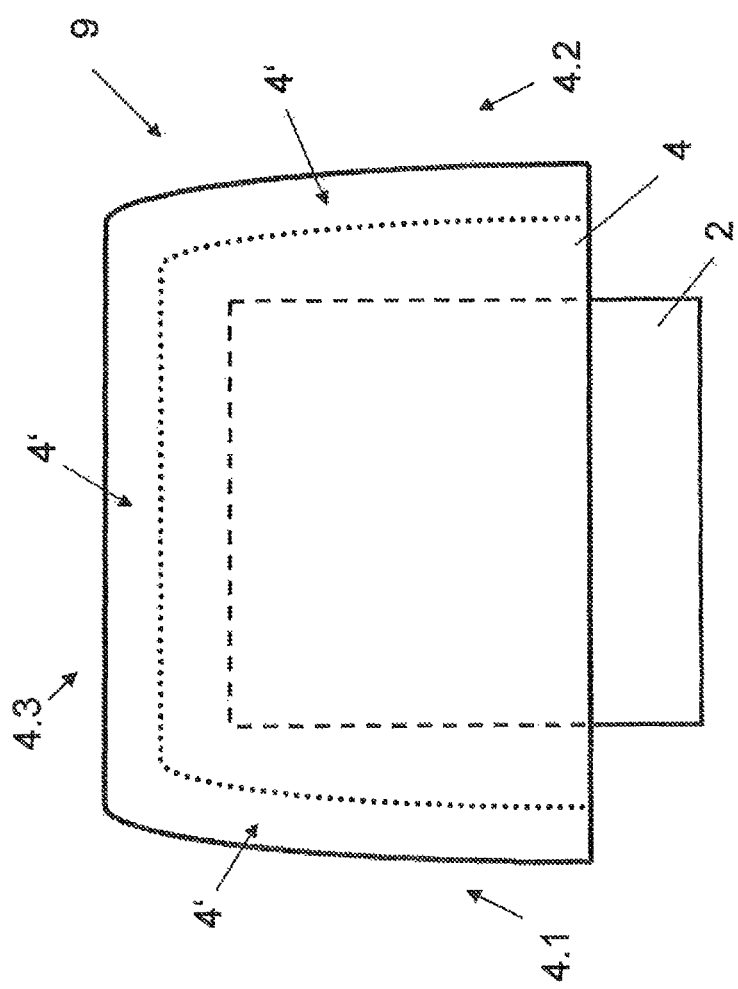
FIG. 7 shows a simplified side view of the arrangement according to FIG. 6.

An alternative variant of embodiment of the invention is represented in FIGS. 6 and 7, and more precisely an arrangement comprising two metal-ceramic substrates 1 according to the invention, wherein edge sections 4.1, 4.2, 4.3 of the second metallization 4 in each case project laterally at least in sections over ceramic layer 3 and are curved in the direction of ceramic layer 2, in such a way that a flange-like bonding region 4' is formed in each case. Flange-like bonding regions 4' of the two mutually opposite metal-ceramic substrates 1 are bonded with one another in such a way that a tank-like metal enclosure 9 preferably arises, which the ceramic layers 2 and the first metallization 3 provided thereon at least partially accommodate. Tank-like metal enclosure 9 thus comprises an elongated-hole shaped, end-face opening through which the ceramic layers 2 each accommodating first metallization 3 are led outwards in order to create a means of connection.

The two metal-ceramic substrates 1 are welded or glued to one another or bonded with one another in some other way permanently and preferably liquid-tight preferably in flange-like bonding regions 4' of the second metallization 4.

Figure 8:
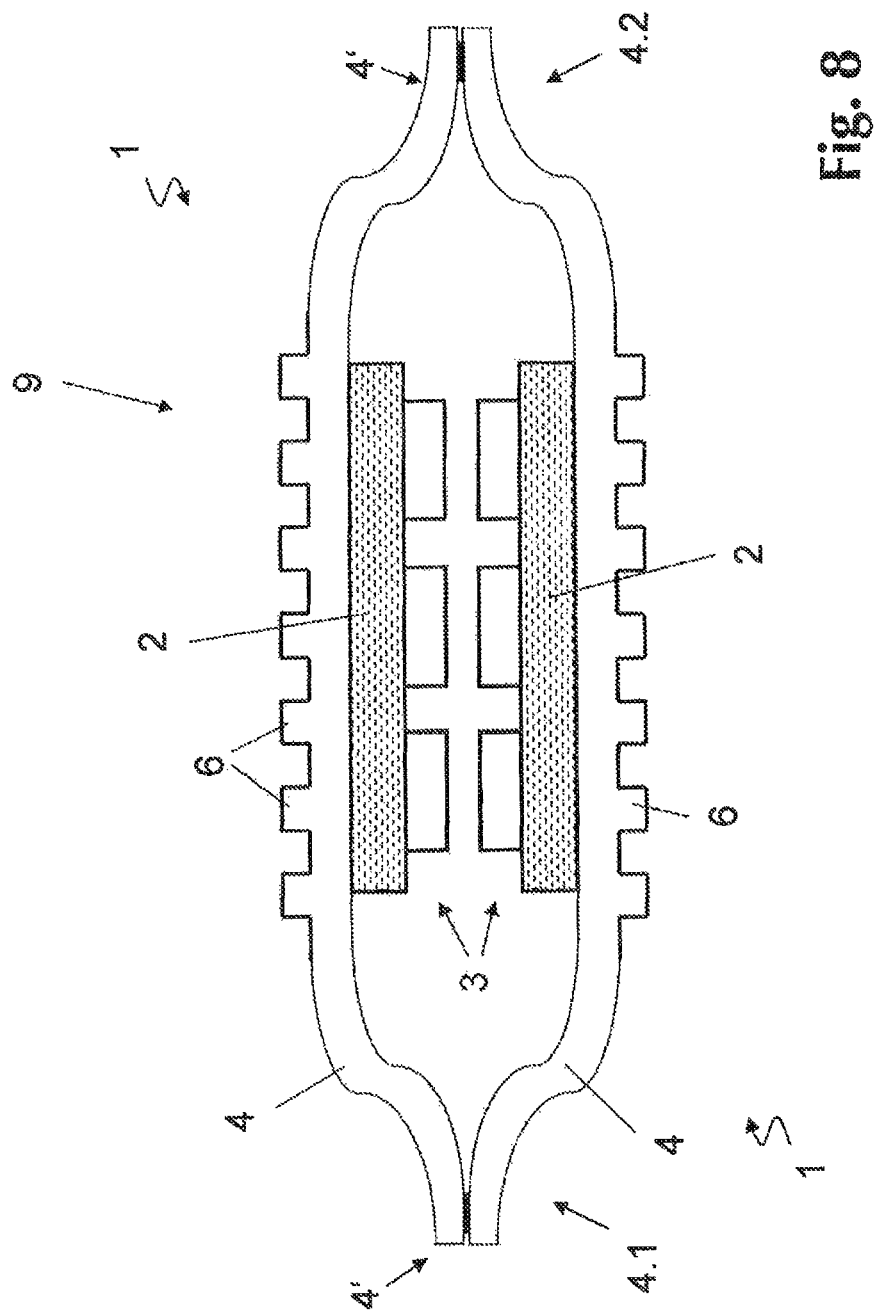
FIG. 8 shows a simplified cross-sectional representation of the arrangement comprising two metal-ceramic substrates according to the invention lying opposite one another and bonded with one another by means of their second metallization, with outwardly pointing cooling elements.

In a further of variant of embodiment according to FIG. 8, which essentially corresponds to the arrangement comprising two metal-ceramic substrates 1 according to the invention represented in FIG. 6, previously described cooling elements 6, which are constituted for example rib-like, are provided on the outwardly directed surface side of the second metallization 4 of metal-ceramic substrates 1. Said cooling elements are preferably provided in the region of the second metallization 4 lying opposite the ceramic layer 2.

Figure 9:
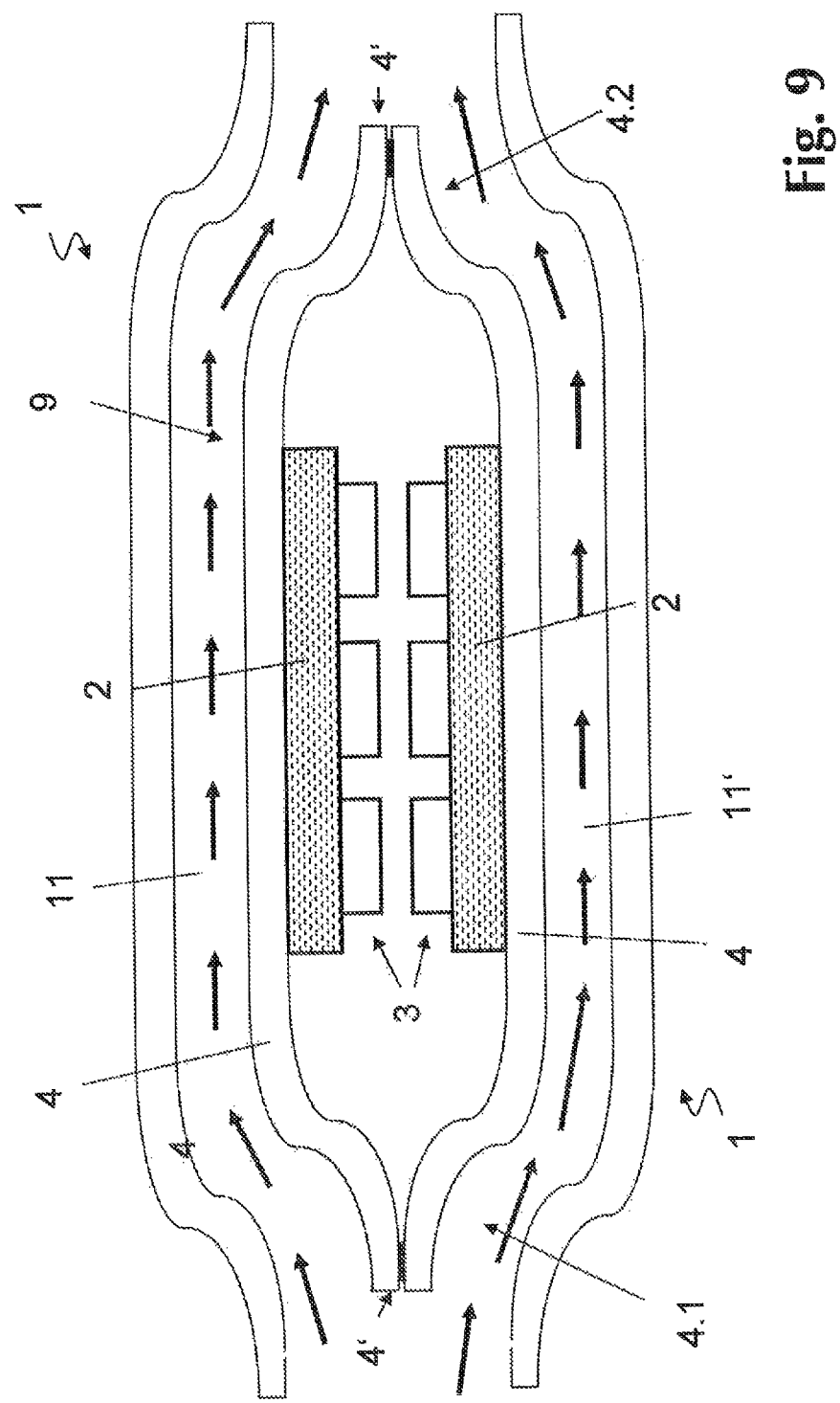
FIG. 9 shows a simplified cross-sectional representation of the arrangement comprising two metal-ceramic substrates according to the invention lying opposite one another and bonded with one another by means of their second metallization, accommodated in a conveying channel conveying the cooling medium.

FIG. 9 shows a cross-sectional representation of a further variant of embodiment of the invention. Here, the arrangement comprising two metal-ceramic substrates 1 according to the invention according to FIGS. 6 and 7 is accommodated in a metal housing 10 conveying the cooling medium, so that at least two guide channels 11, 11' are formed, by means of which the cooling medium is conveyed in the longitudinal direction of the arrangement past the metal-ceramic substrates 1 and the second metallization 4 of metal-ceramic substrates 1 is thus in each case brought into direct contact with the cooling medium. Such a variant of embodiment is particularly well suited for the integration of the arrangement comprising two metal-ceramic substrates 1 according to the invention into the coolant circuit of a motor vehicle. The metal enclosure 9 constituted by the two second metallizations 4 of aluminum or aluminum alloy can be constituted here either tank-like similar to FIG. 7 or closed, wherein a hermetically tight lead-through of the connection lines through the second metallization 4 is provided in the closed embodiment in order to create a connection means for the electrical components or circuit accommodated on the first metallization 3.

In a further variant of the embodiment, the first metallization 3 can also be provided at least partially with a metallic surface layer, for example a surface layer of nickel, silver or nickel and silver alloys. Such a metallic surface layer is preferably applied, after the application of the metallization 3 onto the ceramic layer 2 and its structuring, onto the metallic contact surfaces thus arising. The application of the surface layer takes place in a suitable process, for example galvanically and/or by chemical precipitation and/or by spraying or cold gas spraying. Especially when use is made of nickel, the metallic surface layer has for example a layer thickness in the range between 0.002 mm and 0.015 mm. In the case of a surface layer of silver, the latter is applied with a layer thickness in the range between 0.00015 mm and 0.05 mm, preferably with a layer thickness in the range between 0.01 µm and 3 µm. As a result of such a surface coating of the metallic contact surfaces, the application there of the solder layer or of the solder and the bonding of the solder with the bonding region of the electrical components is improved.

Figure 14:
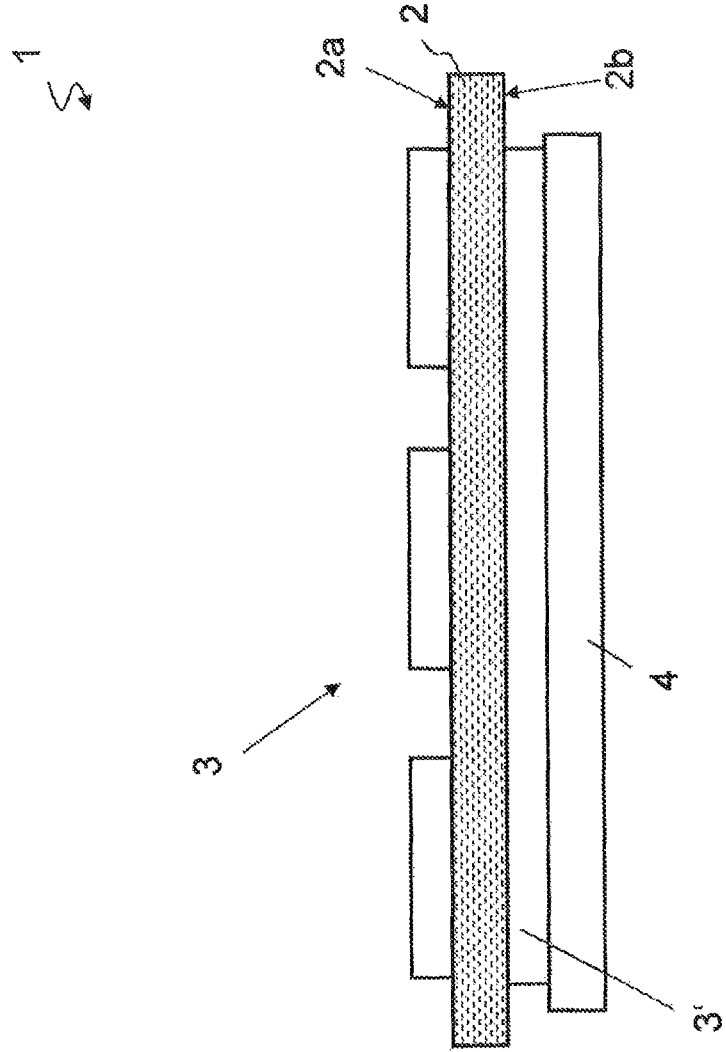
FIG. 14 shows a simplified cross-sectional representation through an alternative variant of embodiment of a metal-ceramic substrate according to the invention, wherein the second metallization of aluminum or an aluminum alloy is indirectly bonded with the ceramic layer, and more precisely by means of a fourth metallization.

A further variant of embodiment of a metal-ceramic substrate according to the invention according to FIG. 1 is represented in FIG. 14, wherein an indirect bonding by means of a fourth metallization 3' is provided instead of a direct two-dimensionally extending bonding of the second metallization 4 with ceramic layer 2. The fourth metallization 3' is preferably constituted by a layer of copper or copper alloy, one surface side whereof is bonded, for example by using the DCB process, with second surface side 2b of ceramic layer 2. The opposite-lying surface side of the fourth metallization 3' is bonded with the second metallization 4 of aluminum or an aluminum alloy, for example by a "direct aluminum bonding" process ("DAB process") or by gluing using a plastic adhesive or a polymer suitable as an adhesive, preferably using an adhesive which contains carbon fibres, in particular carbon nanofibres, with the ceramic layer 2. This variant of embodiment is particularly well suited for cases of application in which the second metallization 4 of aluminum or an aluminum alloy is constituted by at least one flat section of a housing.

The invention has been described above using examples of embodiment. It is understood that numerous changes and modifications are possible without thereby departing from the inventive idea underlying the invention.

LIST OF REFERENCE SIGNS

1 metal-ceramic substrate
2 ceramic layer
2 first surface side
2 second surface side
2.1, 2.2 longitudinal sides
2.3, 2.4 transverse sides
3 first metallization
3' fourth metallization
4 second metallization
4' bonding region
4.1 edge section of second metallization
4.2. edge section of second metallization
5 recesses
6 cooling elements
7 third metallization
8 accommodation space
9 metal enclosure
10 metal housing
11, 11' guide channels

The invention claimed is:

1. A metal-ceramic substrate comprising: at least one ceramic layer, having at least a first metallization on a first surface side of the at least one ceramic layer, having at least a first metallization on a first surface side of the at least one ceramic layer and a second metallization provided on a second surface side of the at least one ceramic layer lying opposite the first surface side, wherein the first metallization is a foil or layer of copper or a copper alloy, and wherein the first metallization is bonded with the first surface side of the at least one ceramic layer by a direct copper bonding process, and the second metallization is a layer of aluminum or an aluminum alloy, wherein the second metallization has a layer thickness between 0.05 mm and 1.0 mm, and wherein a plurality of recesses of differing depth are introduced into a second surface side of the second metallization and the plurality of recesses of differing depth are provided with cooling elements of differing shape or height protruding outwards from the second surface side of the second metallization, and wherein the plurality of recesses of differing depth are constituted in the form of holes extending to the second surface side of the at least one ceramic layer or are introduced into the second surface side of the at least one ceramic layer directly beside one another or overlapping at least in sections of the second surface side of the at least one ceramic layer.

2. The metal-ceramic substrate according to claim 1, wherein a surface of the second metallization is anodized.

3. The metal-ceramic substrate according to claim 1, wherein the first metallization has layer thickness between 0.1 mm and 1.0 mm or is structured for the formation of contact or bonding areas.

4. The metal-ceramic substrate according to claim 1, wherein the second metallization is constituted plate-like, sheet-like or half-shell-shaped.

5. The metal-ceramic substrate according to claim 1, wherein the at least one ceramic layer is produced from aluminum oxide, aluminum nitride, silicon nitride, silicon carbide, or aluminum oxide with zirconium oxide, or has a layer thickness between 0.2 mm and 1.0 mm.

6. The metal-ceramic substrate according to claim 1, wherein the recesses are constituted channel-like, slot-like, oval, elongated-hole shaped, circular or diamond-shaped or extend at least in sections over at least a quarter of a layer thickness of the second metallization.

7. The metal-ceramic substrate according to claim 1, wherein the cooling elements are constituted rib-like, elongated-hole shaped, circular or diamond-shaped or have of a height of 1.0 mm to 10.0 mm.

8. The metal-ceramic substrate according to claim 1, wherein a third metallization is provided, which is bonded at an edge side with the second metallization in order to form a channel-like accommodation space for conveying of a fluid or gaseous cooling medium.

9. The metal-ceramic substrate according to claim 8, wherein the third metallization is produced from aluminum, an aluminum alloy, special steel, a magnesium alloy or from chromium-plated or nickel-plated steels.

10. The metal-ceramic substrate according to claim 1, wherein the second metallization is bonded with the second surface side of the at least one ceramic layer by means of a fourth metallization constituted by a layer of copper or a copper alloy.

11. An arrangement comprising two metal-ceramic substrates according to claim 1, wherein the second metallization on each of the at least one metal-ceramic substrates is constituted half-shell-shaped and mutually opposite metal-ceramic substrates are bonded together in such a way that at least one tank-like metal enclosure arises.

12. The arrangement according to claim 11, wherein the second metallization includes a plurality of edge sections which form flange-like bonding regions.

13. The arrangement according to claim 12, wherein two metal-ceramic substrates are welded or glued to one another or permanently bonded with one another in the flange-like bonding regions.

* * * * *